(12) United States Patent
Gianola et al.

(10) Patent No.: US 11,776,893 B2
(45) Date of Patent: Oct. 3, 2023

(54) COPPER ALLOYS FOR INTERCONNECTORS AND METHODS FOR MAKING THE SAME

(71) Applicant: The Trustees of The University of Pennsylvania, Philadelphia, PA (US)

(72) Inventors: Daniel S. Gianola, Santa Barbara, CA (US); Gyuseok Kim, Wynnewood, PA (US)

(73) Assignee: The Trustees of the University of Pennsylvania, Philadelphia, PA (US)

( * ) Notice: Subject to any disclaimer, the term of this patent is extended or adjusted under 35 U.S.C. 154(b) by 420 days.

(21) Appl. No.: 16/624,045

(22) PCT Filed: Jun. 19, 2018

(86) PCT No.: PCT/US2018/038303
§ 371 (c)(1),
(2) Date: Dec. 18, 2019

(87) PCT Pub. No.: WO2018/236882
PCT Pub. Date: Dec. 27, 2018

(65) Prior Publication Data
US 2020/0194365 A1    Jun. 18, 2020

Related U.S. Application Data

(60) Provisional application No. 62/521,844, filed on Jun. 19, 2017.

(51) Int. Cl.
*H01L 23/00* (2006.01)
*H01B 1/02* (2006.01)
(Continued)

(52) U.S. Cl.
CPC ...... *H01L 23/49866* (2013.01); *B81B 7/0006* (2013.01); *C22C 9/00* (2013.01);
(Continued)

(58) Field of Classification Search
CPC .. H01B 1/02; H01B 1/026; C22C 9/00; C22C 2200/04
See application file for complete search history.

(56) References Cited

U.S. PATENT DOCUMENTS 5,130,274 A    7/1992 Harper et al.
6,090,710 A    7/2000 Andricacos et al.
(Continued)

FOREIGN PATENT DOCUMENTS

WO    WO2009055678    *    4/2009

OTHER PUBLICATIONS

Kaoumi et al "Influence of alloying elements on grain-growth in Zr(Fe) and Cu(Fe) thin-films under in situ ion-irradiation", Journal of Nuclear Materials 382 (2008) 184-189.*
(Continued)

*Primary Examiner* — Mark Kopec
(74) *Attorney, Agent, or Firm* — BakerHostetler (57) ABSTRACT

Metallic alloy interconnects (which can comprise copper) with low electrical resistivity and methods for making the same are disclosed. The electrical resistivity of thin film copper alloys was reduced by 36% with niobium solute and by 51% with iron solute compared to pure copper counterpart in dilute solute regimes (0-1.5 atomic %). The fabrication method is operated at room temperature, and does not require a high temperature annealing step.

16 Claims, 7 Drawing Sheets

(51) Int. Cl.
*C22C 9/00* (2006.01)
*H01L 23/498* (2006.01)
*B81B 7/00* (2006.01)
*C23C 14/20* (2006.01)
*H01L 21/48* (2006.01)
*H01L 23/14* (2006.01)

(52) U.S. Cl.
CPC ........... *C23C 14/205* (2013.01); *H01B 1/026* (2013.01); *H01L 21/4846* (2013.01); *H01L 23/145* (2013.01); *H01L 23/4985* (2013.01)

(56) References Cited

U.S. PATENT DOCUMENTS

| | | | |
|---|---|---|---|
| 8,580,665 | B2 | 11/2013 | Witt |
| 8,852,674 | B2 | 10/2014 | Fu et al. |
| 10,763,000 | B1 * | 9/2020 | Argibay ................. C23C 30/00 |
| 2002/0098680 | A1 | 7/2002 | Goldstein |
| 2005/0277297 | A1 | 12/2005 | Winter et al. |
| 2009/0186230 | A1 * | 7/2009 | Sun ....................... C22C 1/0425 204/192.15 |

OTHER PUBLICATIONS

Apostolopoulos et al "Resonant Kondo scattering in Cu(Fe) thin film", J. Phys.: Condens. Matters (1996) 1381-1387.*
Fenn et al "Electrical resistivity of Cu and Nb thin films", J. Phys.: Condens. Matter 10 (1998) 1707-1720.*
Tchhopp et al ""Bulk" nanocrystalline metals: Review of the current state of the art and future opportunities for copper and copper alloys", JOM, vol. 66, No. 6, 2014.*
Chookajom et al., "Design of stable nanocrystalline alloys," Science, vol. 337, (2012), pp. 951-954.
DNP, http://www.dnp.co.jp., retrieved on Feb. 16, 2021.
Gambino, Improved reliability of copper interconnects using alloying, 2010 17th IEEE Int. Symp. Phys. Fail. Anal. Integr. Circuits (2010) 1-7.
Kim et al., "Grain boundary segregation and electrical/mechanical properties in dilute nanocrystalline Cu alloys," Penn, 2016, 1 page.
Kim et al., Indium-free, highly transparent, flexible Cu2O/Cu/Cu2O mesh electrodes for flexible touch screen panels, Scientific Reports, 5:16838, 2015, 10 pages.
Kim et al., Interplay between grain boundary segregation and electrical resistivity in dilute nanocrystalline Cu alloys, Scripta Materialia, vol. 123, Oct. 2016, pp. 113-117.
Magagnosc et al., "Effect of ion irradiation on tensile ductility, strength and fictive temperature in metallic glass nanowires," Acta. Mater, vol. 74, (2014), pp. 165-182.
Steinhogl et al., "Size-dependent resistivity of metallic wires in the mesoscopic range," Phy. Rev. B , vol. 66, 075414 (2002).
Baskaran et al., "Pulsed electrodeposition of nanocrystalline Cu—Ni alloy films and evaluation of their characteristic properties", Materials Letters, vol. 60, issue 16, Jan. 10, 2006, pp. 1990-1995.
Tummala et al., "Copper Interconnections for High Performance and Fine Pitch Flipchip Digital Applications and Ultra-miniaturized RF Module Applications", 56th Electronic Components and Technology Conference, Jul. 5, 2006, 102-111.

* cited by examiner

COPPER ALLOYS FOR INTERCONNECTORS AND METHODS FOR MAKING THE SAME

CROSS-REFERENCE TO RELATED APPLICATIONS

The present application is the National Stage Application of International Patent Application No. PCT/US2018/038303, filed Jun. 19, 2018, which claims priority to and the benefit of U.S. Patent Application No. 62/521,844, "Copper Alloys for Interconnectors and Methods for Making the Same" (filed Jun. 19, 2017), the entireties of which applications are incorporated by reference for any and all purposes.

GOVERNMENT RIGHTS

This invention was made with government support under Contract No. DE-SC0008135 awarded by the United States Department of Energy. The government has certain rights in the invention.

TECHNICAL FIELD

The present disclosure relates to nanocrystalline alloy thin films for interconnectors and other electronics applications and to methods of making the same.

BACKGROUND

Nanocrystalline (NC) metals have been the subject of intense research activity, driven largely by technological interests in their high hardness and strength. The results from decades of experiments and simulations point to the governing role of deformation physics unique to its coarse-grained counterparts, including grain boundary (GB) sliding, nucleation of dislocations from GBs and their subsequent isolated propagation, GB rotation, and stress-assisted grain growth.

Owing to the large volume fraction of material in near-GB regions in nanocrystalline metals, the properties of these materials are governed by interfacial phenomena. In parallel with new insights on deformation mechanisms, the technological use of metallic thin films and coatings as electrical interconnects and structural features in microelectromechanical or nanoelectromechanical systems (MEMS/NEMS), which often are nanostructured by virtue of the non-equilibrium processing routes used to synthesize them, necessitates a proper optimization of both electrical and mechanical properties. For instance, interconnect materials with dimensions that are ever-miniaturizing require low electrical resistivity so as to cope with thermal management from Joule heating at ultra-high current densities. Furthermore, reliability concerns focus on mitigation of electromigration, thermal stress and shock, and fatigue.

Despite an emerging understanding of deformation physics and concomitant properties, the majority of studies have focused on nominally pure systems. The lack of understanding of mechanical and electrical behavior in more chemically-complex nanocrystalline metals largely limits the wide use of alloy systems.

For applications where Ohmic losses are to be minimized, the role of solutes is largely a deleterious one, with the reduction in grain size and increased alloying content leading to interface and impurity scattering, respectively. Correspondingly, thermal annealing of pure Cu is generally employed to reduce electrical resistivity during processing. Thus, materials engineers are often faced with a compromise between thermal stability, electrical conductivity, mechanical reliability, and the feasibility of high temperature processing in cases where flexible polymeric substrates are of interest.

Due to ever increasing needs for higher performance, better heat dissipation and longer lifetime in electronic devices, the development of interconnects with low resistance is of great importance. Although the resistance of interconnects can be reduced by increasing area and decreasing length, the trend of development goes in opposite directions (decreasing area and increasing length) to densely integrate the interconnects in confined volumes. For instance, to achieve improved performance, more interconnects needs to be generated in the same volume. As the total length of interconnects in a chip increases, their thickness and width need to be reduced, giving rise to increased resistance. Accordingly, there is a long-felt need in the art for interconnects having improved performance as well as improved processes for forming such interconnects.

SUMMARY

Provided here are nanocrystalline (NC) copper alloys and fabrication methods for use in interconnects with lower electrical resistivity compared to pure NC copper counterparts. It has been found that specific electrical resistivity non-monotonically varies with the content of solutes irrespective of the solute species. Whereas pure copper films were found to have a resistivity value of 9.3 $\mu\Omega$-cm, strikingly, one finds that, in the dilute regime (~1.5 atomic percent ("at. %") Nb and Fe), the resistivity drops by up to 36% with Nb solutes and 51% with Fe solutes relative to pure Cu. Without being bound by any particular theory, one can hypothesize that the observed surprising changes in resistivity can be primarily attributed to the microstructural changes, most notably the increase in grain size, because the high resistivity in thin film or nanocrystalline form relative to that of bulk (1.7 $\mu\Omega$-cm) is attributed to size effects associated with reduced thickness or grain sizes, as well as the potential influence of roughness.

The invention herein described provides a material composition and fabrication method of Cu alloy having lower resistivity than that of pure counterparts. Further, the compositions, apparatuses, and methods herein described do not require additional thermal annealing to achieve low resistivity. Therefore, the disclosed methods can be used to fabricate electronic devices without the need for annealing steps that are not amenable to flexible electronic applications (e.g., wearable devices and touch sensors) composed of polymer substrates with interconnects disposed thereon.

Moreover, the technology provided herein does not necessarily require thermal treatment or alloying at high temperature for reduced resistivity (i.e., it does not require high temperature sputtering or other physical vapor deposition processes). Processing that requires thermal annealing at high temperature can lead to the degradation of dielectric materials and thermal stress due to the mismatch of thermal expansion coefficient between interconnect and dielectric material. To the contrary, this disclosure provides Cu alloying in room temperature physical vapor deposition processes, e.g., sputtering, which in turn allows for the use of substrates (e.g., flexible polymers) that have degradation temperatures too low for existing, high-temperature processes. In this way, the presently disclosed technology expands the universe of substrates onto which integrated circuits can be placed.

Finally, the present disclosure provides a one-step processing method to yield a functional NC copper alloy thin film for use as an interconnect in, for example, electronics applications, thereby advantageously avoiding the need for multiple steps of deposition with different layers or additional thermal annealing steps for alloying.

BRIEF DESCRIPTION OF THE DRAWINGS

The summary, as well as the following detailed description, is further understood when read in conjunction with the appended drawings. For the purpose of illustrating the invention, there are shown in the drawings exemplary embodiments of the invention; however, the invention is not limited to the specific methods, compositions, and devices disclosed. In addition, the drawings are not necessarily drawn to scale. In the drawings:

FIG. 1. Bright-field-TEM images showing the microstructure of pure NC Cu and Cu alloys. (a) Pure Cu, (b) Cu-0.64 at. % Nb, (c) Cu-3.20 at. % Nb, (d) Cu-0.73 at. % Fe, and (e) Cu-2.58 at. % Fe. The micrographs show that the grain sizes of dilute alloy samples are larger than those of pure Cu. The insets are the corresponding diffraction patterns. The bright and discontinuous spots in diffraction ring in (b) and (d) also indicate the larger mean grain sizes of dilute alloy samples. The scale bar indicates 50 nm.

FIG. 2. Grain size statistics shown as cumulative area fraction of representative batches in the (a) Cu—Nb system (b) Cu—Fe system.

DETAILED DESCRIPTION OF ILLUSTRATIVE EMBODIMENTS

The present invention may be understood more readily by reference to the following detailed description taken in connection with the accompanying figures and examples, which form a part of this disclosure. It is to be understood that this invention is not limited to the specific devices, methods, applications, conditions or parameters described and/or shown herein, and that the terminology used herein is for the purpose of describing particular embodiments by way of example only and is not intended to be limiting of the claimed invention. Also, as used in the specification including the appended claims, the singular forms "a," "an," and "the" include the plural, and reference to a particular numerical value includes at least that particular value, unless the context clearly dictates otherwise. The term "plurality", as used herein, means more than one. When a range of values is expressed, another embodiment includes from the one particular value and/or to the other particular value. Similarly, when values are expressed as approximations, by use of the antecedent "about," it will be understood that the particular value forms another embodiment. All ranges are inclusive and combinable, and it should be understood that steps may be performed in any order.

It is to be appreciated that certain features of the invention which are, for clarity, described herein in the context of separate embodiments, may also be provided in combination in a single embodiment. Conversely, various features of the invention that are, for brevity, described in the context of a single embodiment, may also be provided separately or in any subcombination. Further, reference to values stated in ranges include each and every value within that range.

One approach for reducing resistance is to employ materials with lower resistivity. Copper can be used as an interconnect material because it has lower electrical resistivity and higher resistance to electro-migration compared to, for example, aluminum. Whereas the addition of solutes into copper can improve its reliability (U.S. Pat. No. 6,090, 710, the contents of which are incorporated herein by reference), solutes can also increase resistivity due to the solute creating scattering sites for electrons by either incorporating unavoidable impurities or resulting in refinement of grain size. This approach, however, requires employing pure copper followed by thermal annealing at often unfavorably high temperatures.

The present disclosure describes the use of co-sputtering of pure Cu with Cu-M (M=niobium, iron, zirconium, tungsten, or gold, or the like) alloys to produce non-monotonic grain refinement in NC Cu alloys. Without being bound by any particular theory, detailed microstructural characterization suggests that the apparent breakdown of the inverse correlation between grain size and alloying content in the dilute regime is caused by competition between the internal driving force from solute misfit strain and solute drag effects. These non-equilibrium effects enabled by sputtering deposition methods are linked to the spatial distribution of solute atoms, adding another dimension to microstructural and chemical control in nanocrystalline alloys.

This disclosure describes applying this unique microstructural and chemical control to tailor the electrical conductivity of Cu thin films for interconnect applications, where deleterious increases in resistivity with decreasing device size (leading to lowered energy efficiencies and increased parasitic heating) pose a substantial challenge. These insights are used to produce thermally stable NC alloy thin films with both lower electrical resistivity and higher hardness than their pure NC Cu counterpart.

In exemplary testing, NC pure and alloyed Cu thin films were deposited onto high purity Si (001) dies with nominal widths of 20 mm using physical vapor deposition (AJA ATC Orion Sputtering Deposition System), co-sputtered from pure Cu and Cu96M4 alloy targets, where M is either Nb or Fe. The targeted compositional range of solutes was 0 to 4 at. %. To minimize un-wanted impurity contamination, high purity sputtering targets (99.999% for Cu, 99.95% for CuNb and CuFe) were used, and synthesis was performed when the chamber base pressure reached b $7 \times 10^{-8}$ mbar. Sputtering deposition was performed at an Ar pressure of $5.2 \times 10^{-3}$ mbar. The sample stage was continuously rotated during sputtering to achieve uniformity of the thin films.

To control the composition of the sputtered binary alloy films, the power applied to each sputtering target was adjusted as listed in Table 1. The growth rate of the thin films was maintained between 0.10 and 0.15 nm/s. Proper sputtering time was selected to control the film thickness to be nominally between 50 and 60 nm. To confirm the reproducibility of the measured properties of the thin films, 35 batches of samples were deposited. Energy dispersive spectroscopy (EDS) and focused ion beam (FIB, FEI Strata DB 235) cross-sectioning were used to measure the composition and the thickness of films, respectively. The microstructure of the films was further investigated with transmission electron microscopy (TEM, JEOL 2100). Quantitative grain size analyses for both alloy systems were performed with plan-view dark field TEM images. At least 600 grains were measured for each composition, from which full grain size statistics were calculated. Ratios of the lattice constants of the Cu alloys to pure Cu were obtained by measuring the relative diameter of the diffraction rings visible in each thin film and performing linear regression of the relative diameter to the composition.

TABLE 1

Representative sputtering conditions and resultant thickness, composition and grain size of films.

| Solute | Sputtering power Cu (W) | Sputtering power $Cu_{96}M_4$ (W) | Thickness (nm) | Solute concentration (at. %) | Mean grain size (nm) |
|---|---|---|---|---|---|
| — | 200 | 0 | 58.2 (±1.1) | 0 | 10.1 (±5.9) |
| M = Nb | 200 | 50 | 46.4 (±1.8) | 0.64 (±0.08) | 12.2 (±7.0) |
| | 200 | 100 | 46.8 (±2.3) | 1.14 (±0.13) | 13.6 (±7.9) |
| | 150 | 200 | 47.7 (±1.9) | 1.96 (±0.06) | 7.9 (±4.3) |
| | 0 | 200 | 60.0 (±1.9) | 3.20 (±0.10) | 7.8 (±4.9) |
| M = Fe | 200 | 20 | 69.4 (±2.2) | 0.46 (±0.16) | 13.2 (±7.1) |
| | 200 | 50 | 61.0 (±3.0) | 0.73 (±0.24) | 14.5 (±8.6) |
| | 200 | 100 | 63.2 (±1.6) | 1.08 (±0.37) | 12.5 (±6.1) |
| | 150 | 200 | 57.8 (±3.6) | 1.41 (±0.46) | 12.3 (±6.0) |
| | 0 | 200 | 53.0 (±3.0) | 2.58 (±0.07) | 10.0 (±4.5) |

A 4-point electrical probe method with a truncated conical tip outfitted with a 50 μm radius of sphere was employed to measure the average sheet resistance of the thin films (Cascade 4 point probe, Keithley 2000 multi-meter, Agilent E3612A power supply). This measurement technique provided an accurate resistance value by eliminating the error associated with the internal and contact resistances stemming from the probe tips and leads. The obtained sheet resistances were corrected by multiplying the values by the sample size correlation factor, and accounting for the average thickness of each thin film as measured by cross sectioning with the FIB and subsequent SEM imaging.

The representative sputtering conditions for each batch and the resultant thickness, composition and grain size are listed in Table 1. Alloying contents as high as 3.2 at. % and 2.6 at. % were achieved for Nb and Fe, respectively. In this range, the microstructure is seen as nanocrystalline (FIG. 1), with mean grain sizes in all films (both pure Cu and alloyed) falling well below 20 nm.

Figure 1A:
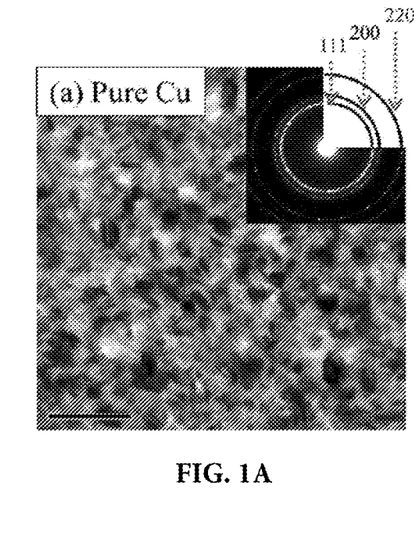
Figure 1B:
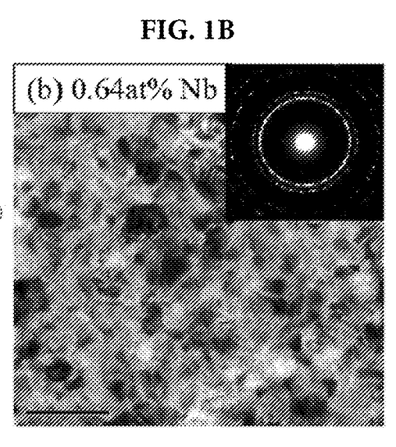
Figure 1C:
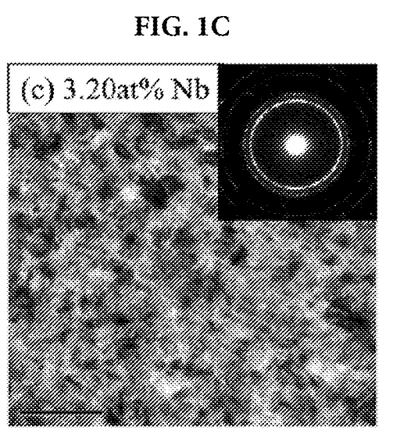
Figure 1D:
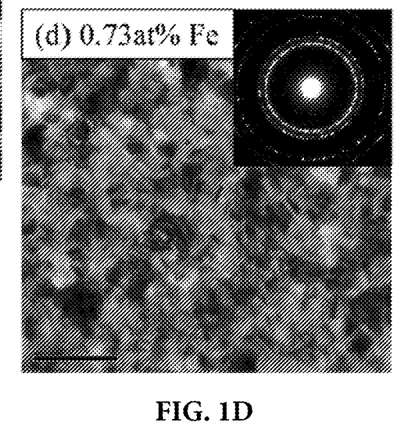
Figure 1E:
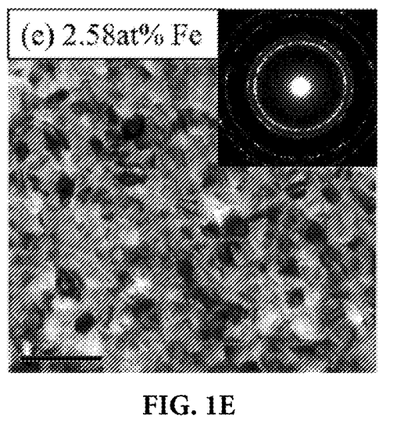
Figure 2A:
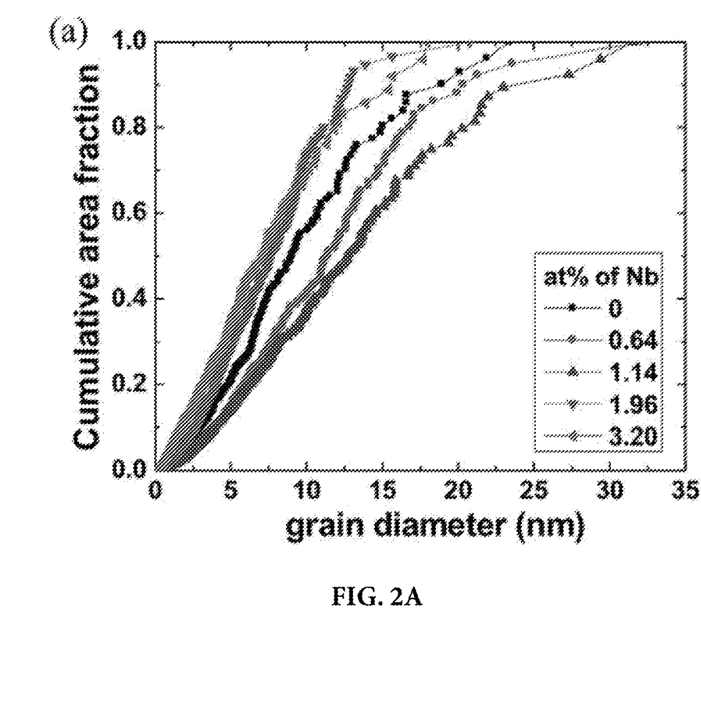
Figure 2B:
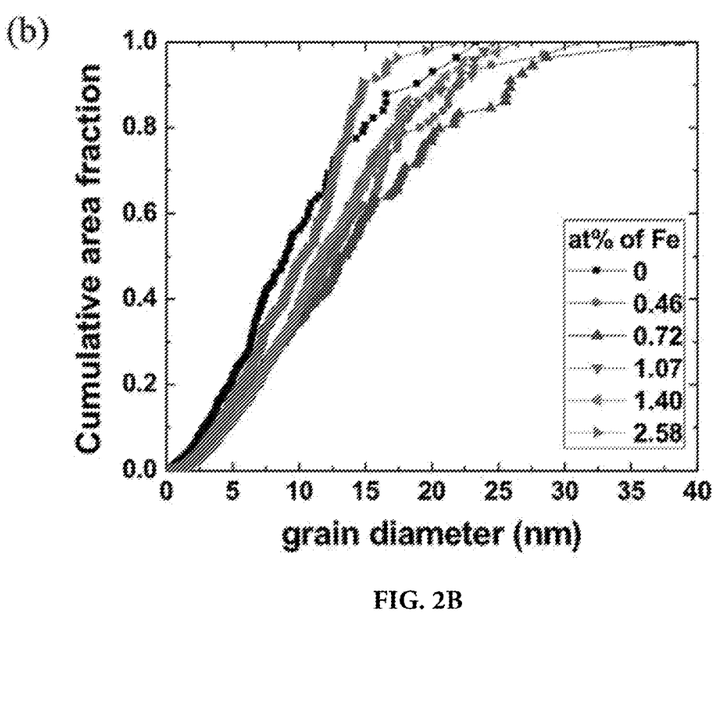
Figure 3:
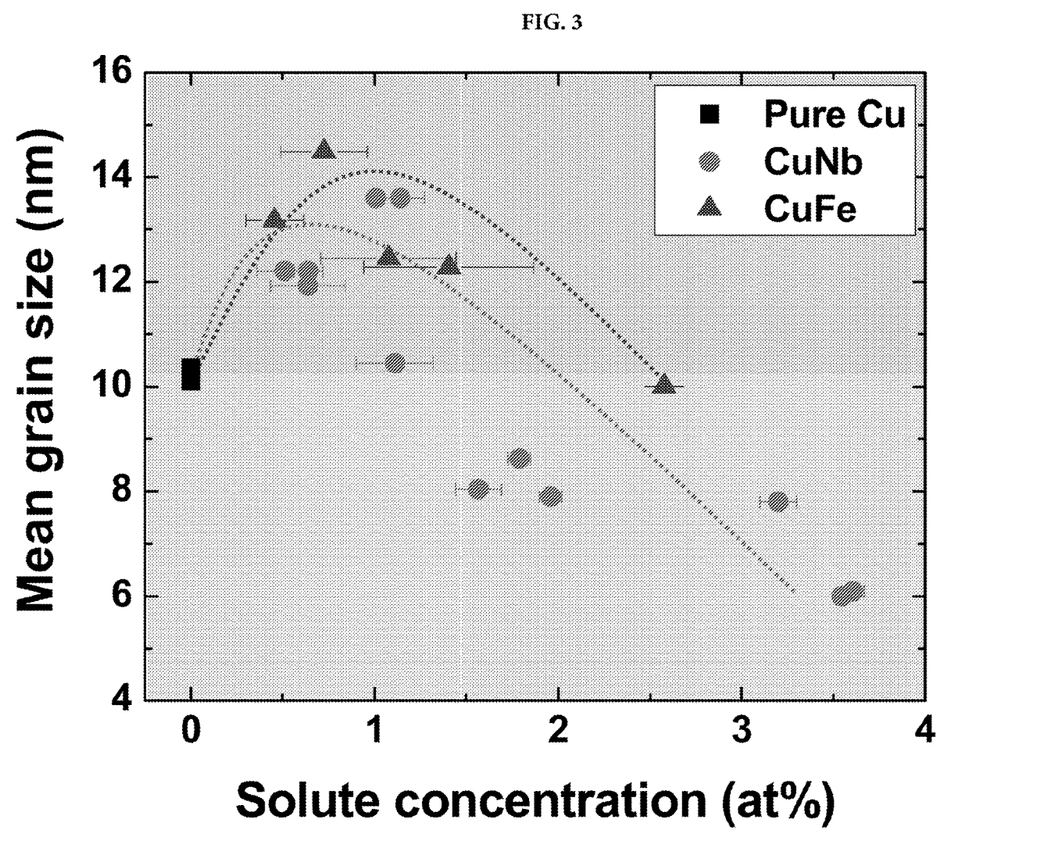
FIG. 3. Dependence of mean grain size on the solute concentration. The shaded areas indicate regimes of grain coarsening (red) and grain refinement (blue). Dashed lines are guides for the eye.

The trends in grain size as a function of composition become quantitatively apparent when examined as cumulative distribution functions of grain sizes, as shown for Cu—Nb (FIG. 2(a)) and Cu—Fe (FIG. 2(b)), as well as mean grain sizes (FIG. 3). Grain coarsening occurs in the range of 0 to 1.5 at. % Nb and 0 to 2.5 at. % Fe (FIG. 3, red shaded region). Specifically, whereas the mean grain size of the pure Cu film is 10.1 nm, those of 1.14 at. % Nb and 0.73 at. % Fe increased to 13.6 nm (35% increase) and 14.5 nm (44% increase), respectively. Notably, grain growth over time was not observed at room temperature, which implies that such a significant increase in grain size occurred as a consequence of the non-equilibrium nature of sputter deposition, without the need for subsequent thermal annealing or room temperature aging. Without being bound to any particular theory, this suggests the spatial distribution of the solutes could also be a function of the global alloying content.

Figure 4:
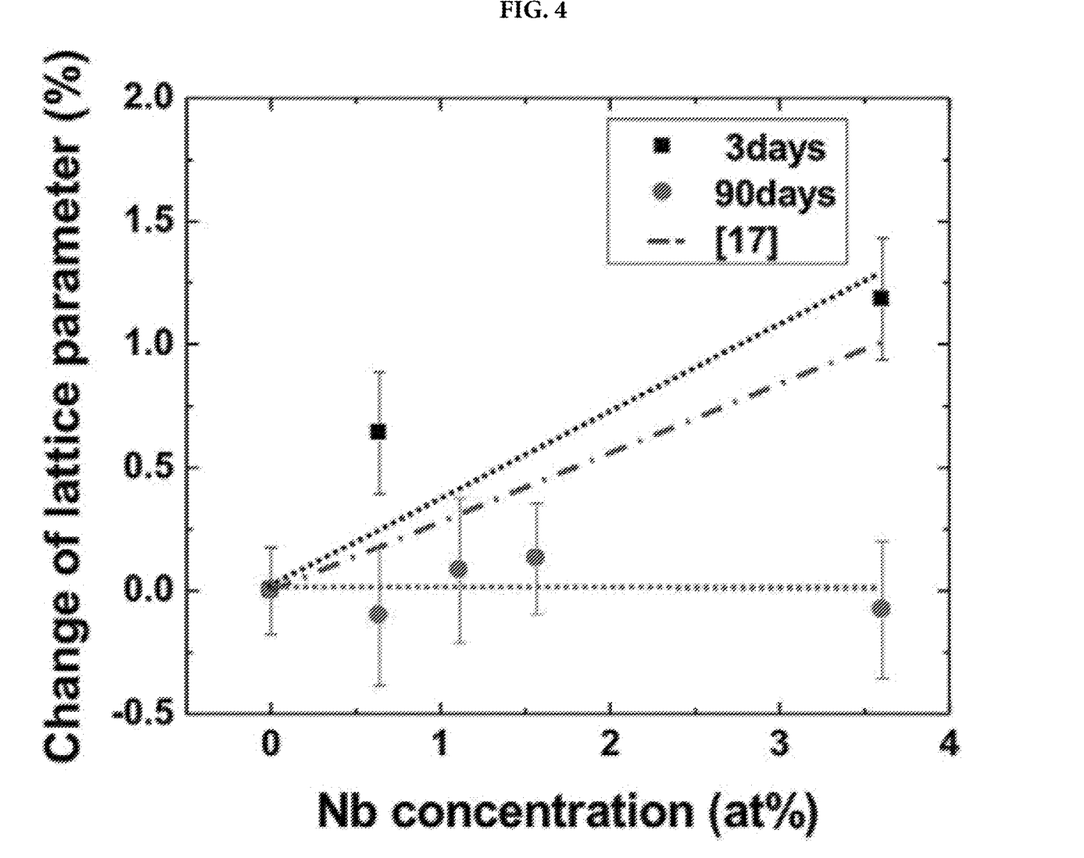
FIG. 4. Change in lattice parameter of CuNb relative to pure Cu after 3 days and 90 days from sputtering deposition.

To understand the origin of the grain coarsening in the dilute regime for both alloys, the lattice parameters of Cu—Nb films relative to those of pure Cu were measured from TEM diffraction patterns (FIG. 4). Lattice parameters were measured at two time intervals (3 and 90 days after deposition) to determine the influence of room temperature aging processes. Whereas the relative lattice parameters of the Cu—Nb alloys measured shortly after 3 days are larger than that of pure Cu signifying a misfit strain from substitutional point defects, those measured 90 days after deposition were almost the same as that of pure Cu irrespective of the global Nb content. Because the diffraction patterns reflect the intragranular regions of the material where coherent scattering of electrons occurs and not those regions in close proximity to grain boundaries, this result indicates that the solutes are more uniformly distributed in the material shortly after the sputtering, and over time subsequently segregate to grain boundaries (or potentially surfaces). Again without being bound to any particular theory, this suggests that room temperature diffusion is relatively sluggish despite the strong tendency for grain boundary segregation (positive enthalpy of segregation) in both alloys. This can be reconciled by considering the low diffusivity of Nb in Cu at room temperature which in the scenario could be somewhat accelerated given the expectation of a relatively large concentration of vacancies due to the non-equilibrium sputtering conditions and short diffusion lengths attributed to the very small grain sizes. Thereby, these mechanisms can help solutes redistribute from grain interiors to grain boundary regions over time scales of days, ultimately relaxing the grain interior misfit strains while modifying the grain boundary chemistry. The solutes residing in the grain interior generate a misfit strain magnitude that depends on the atomic mismatch between solvent and solute as described by Vegard's law, and quantified by a lattice misfit strain parameter, $\eta=(1/\alpha)(\delta\alpha/\delta c)$, where $\alpha$ is the lattice constant of the pure solvent or copper alloy and c is the atomic percent ratio of copper to solute in the composition.

Also examined was a Cu—Nb alloy system co-sputtered by PVD as obtained from X-ray diffraction experiments. A relative lattice parameter measured 3 days after deposition in FIG. 4 gives $\eta=0.35$. Without being bound by any particular theory, the present inventors believe that this is due to a certain concentration of solutes residing in intragranular sites directly after sputtering, rather than rapidly diffusing or segregating in the grain boundary, causing misfit strain in the grain interior.

It is known that energetically unfavorable intragranular solutes with, for instance, large atomic mismatch with the solvent or positive enthalpy of segregation prefer to reside at grain boundaries since segregation of solutes can reduce the grain boundary energy. The Nb and Fe solutes are immiscible in Cu at room temperature, with a positive enthalpy of segregation of Nb and Fe in Cu. Thus, it is believed that Nb and Fe solutes reside in the near vicinity of grain boundaries. The sputtering process, however, also produces non-equilibrium vacancy concentrations, and thereby intragranular sites for solutes to be located. Moreover, the sputtering power for the alloy target is two to ten times smaller than that for pure copper. The significantly lower energy of the adsorbing alloying elements will consequently provide limited momentum that facilitates surface mobility, enabling the solutes to segregate to grain boundaries. As a result, the kinetically trapped intragranular solutes will lead to the generation of a misfit strain energy. This, in turn, results in the driving force for grain growth to relieve the stored excess energy. Without committing to any single theory, increasing the global content of solute may provide a greater driving force unless grain boundary segregation can occur. Grain growth caused by elastic anisotropy has a directional bias for grain boundary motion.

In contrast, the grain growth mechanism suggested by these results is governed by a driving force arising from the heterogeneity of the strain field in the solid solution (analogous to recrystallization). On the other hand, the solutes retard the grain boundary migration necessary for grain growth by kinetic drag. The drag force P caused by impurities can be expressed as $P=vk_BT\Gamma/D$, where v is the velocity of grain boundary, $k_B$ is the Boltzmann constant, T is the temperature, $\Gamma$ is the number of excess impurities per unit area of grain boundary, and D is the bulk diffusivity. As the number of solutes increase or diffusivity decreases, the drag force increases. Taken as a whole, the competition between the roles of the increasing driving force for grain growth and the increasing drag force with increasing global alloying content presumably governs regimes of both grain growth and refinement.

Figure 5:
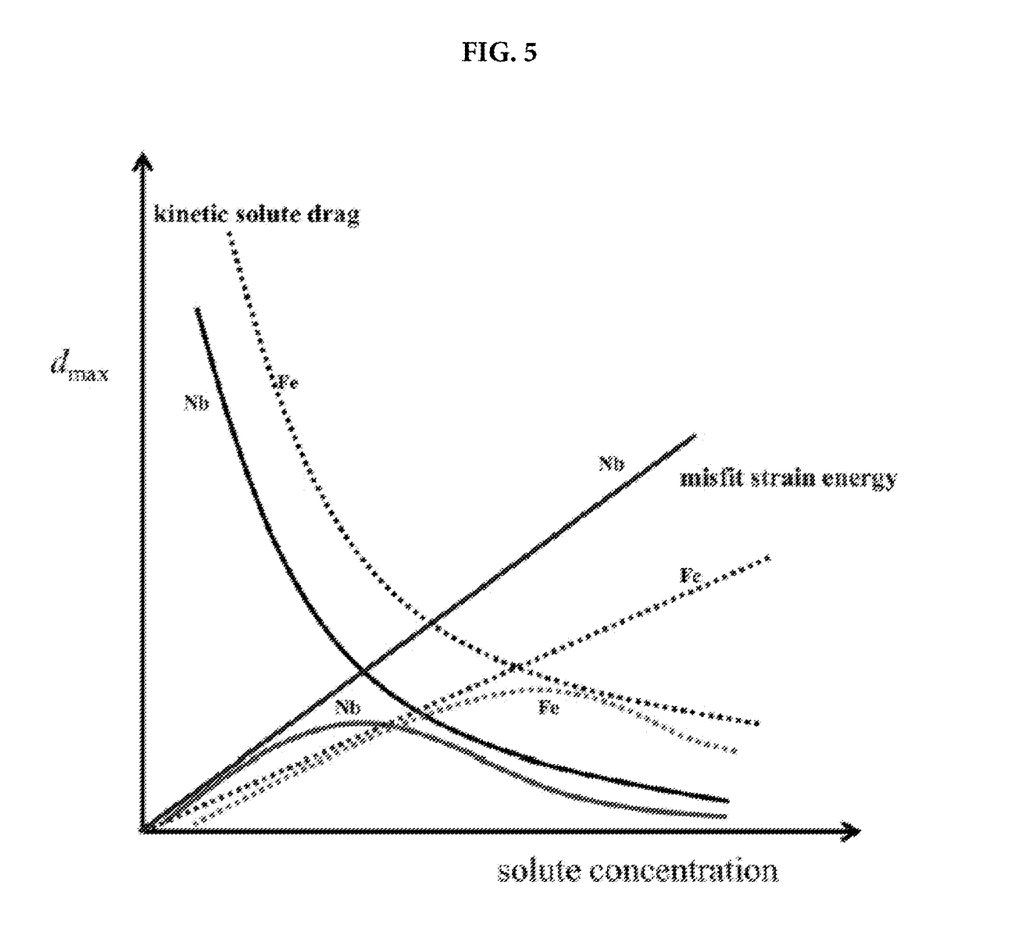
FIG. 5. Schematic of maximum grain size dmax as a function of solute concentration. Two different mechanisms, internal misfit strain energy and kinetic solute drag, compete with each other to determine the resultant grain size.

In light of the competing mechanisms of misfit strain energy and kinetic solute drag, without being bound to any particular theory, one can propose a schematic view of the maximum grain size in the sputtered films as a function of composition (FIG. 5). The grain size scales with the misfit strain energy, with a strength that depends on the atomic radius mismatch between solute and solvent. As the measured lattice misfit strain parameter of Nb in Cu is $\eta=0.35$ while that of Fe in Cu is $\eta=0.02$, Nb solutes provide the greater driving force for grain growth per unit global content of solute. On the other hand, the grain size should scale inversely to kinetic solute drag. Since the diffusivity of Nb in Cu is lower than that of Fe in Cu, Nb solutes will more strongly retard the migration of grain boundary. The net result of these competing mechanisms sets the non-monotonic shape of the measured grain sizes as a function of both Nb and Fe solute concentrations, consistent with the experimental results in FIG. 3. Experimental results show that the mean grain size peaks in the dilute regime (below about 1.5 at. %).

Figure 6:
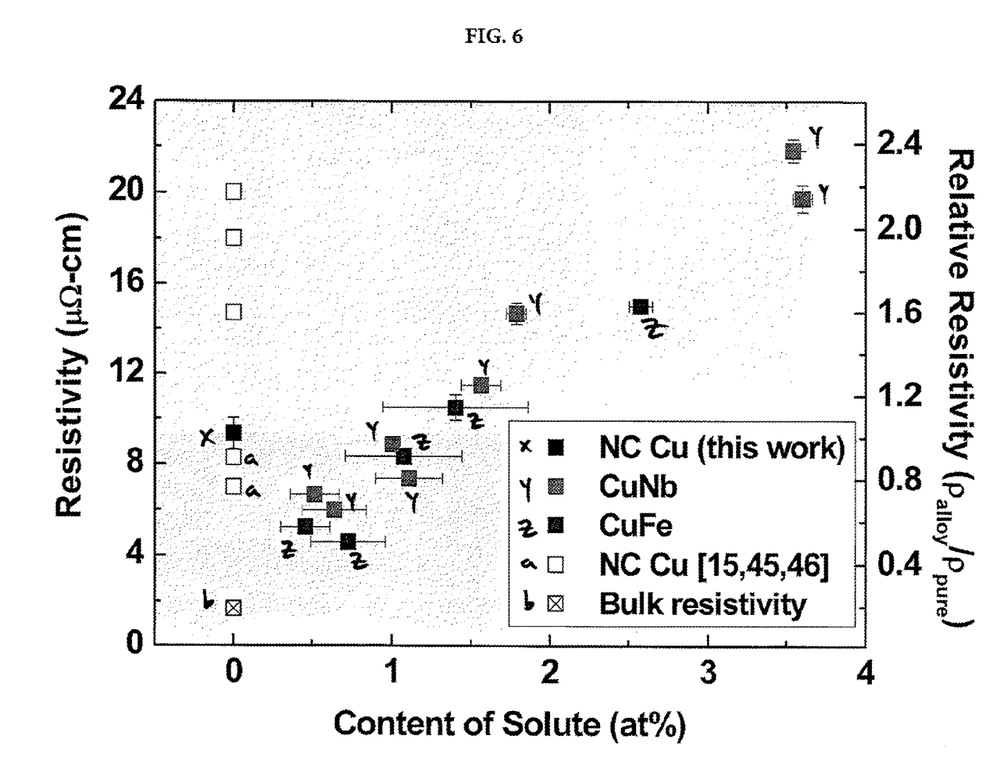
FIG. 6. Electrical resistivity of pure Cu and Cu alloy as a function of solute concentration. The shaded regions show where the resistivity is lower (red) or higher (blue) than that of the pure Cu films. The error bars represent standard deviations of resistivity (vertical) and EDS (horizontal) measurements. For comparison, the resistivities in NC Cu from various references and bulk Cu resistivity are also plotted.
Figure 7:
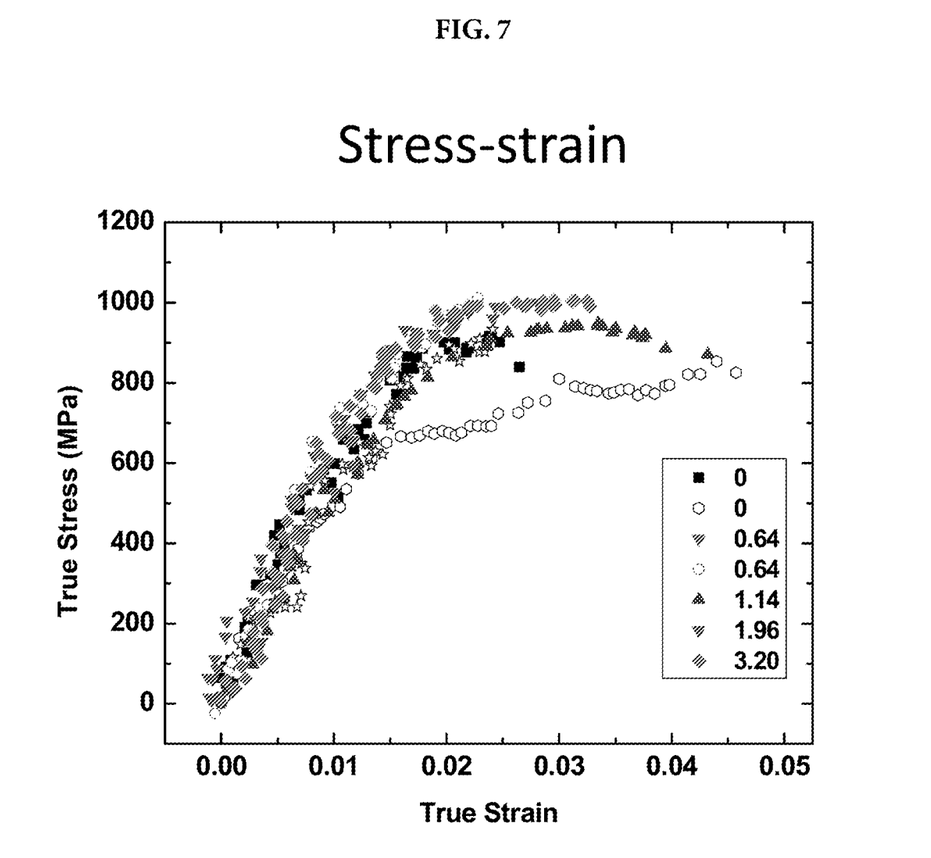
FIG. 7. Stress-strain response of pure copper and copper alloy as a function of atomic percent of Nb. The data were obtained by tensile testing of exemplary thin film as described herein.

The present disclosure also provides surprising relationships between the microstructure and chemical variations and electrical properties of the sputtered films, which would be expected to be governed by both grain boundary and impurity scattering mechanisms. Measurements of the normalized electrical resistivity of the pure Cu and Cu alloy thin films are shown in FIG. 6. Beginning with the pure copper films, a resistivity value of 9.3 $\mu\Omega$-cm was measured, similar to values reported in nanocrystalline Cu of approximately 7 $\mu\Omega$-cm in films prepared via PVD and 18 $\mu\Omega$-cm in coatings prepared with electroplating methods. The high resistivity in thin film or nanocrystalline form relative to that of bulk (1.7 $\mu\Omega$-cm) is attributed to size effects associated with reduced thickness or grain sizes, as well as the potential influence of roughness. One can note that the resistivities of Nb samples are higher than Cu counterparts when synthesized using the same method. The addition of Nb solutes in Cu generally leads to increases of resistivity as Nb provides additional scattering sites for electrons.

Here, it was surprisingly found that the resistivity non-monotonically varies with the content of solutes irrespective of the solute species, as shown in FIG. 6. Strikingly, one can find that, in the dilute regime (~1.5 at. % Nb and Fe), the resistivity drops by up to 36% with Nb solutes and 51% with Fe solutes relative to pure NC Cu (red shaded region of FIG. 6). Such behavior in resistivity can be primarily attributed to the micro-structural changes previously described, most notably the increase in grain size.

To understand these results, one can estimate the resistivity changes predicted by the Fuchs-Sondheimer (FS) and Mayadas-Shatzkes (MS) phenomenological models which give the influence of thickness and grain size, respectively. Since the film thickness was kept fixed at ~50 nm, the contributions of the resistivity from thickness should be invariant to alloying content. The resistivity-grain size relationship in the dilute regime (below about 1.5 at. %) approximately follows the trend predicted by a cumulative FS-MS model, suggesting that other effects such as scattering from solute atoms or vacancies play a negligible role. At ~1.3 at. % of solute, the resistivity of the alloy matches that of the pure Cu films. Above about 1.5 at. %, the resistivity monotonically increases, with the FS-MS model underpredicting both the absolute value of resistivity and its dependence on grain size, indicating that point defect scattering becomes substantial in addition to the grain refinement.

One can hypothesize such discrepancies reflect the distinct spatial distribution of solutes (intra- vs. intergranular) which additionally mediate the resistivity. This is further corroborated by the result that the resistivity uniformly decreases after 70 days of aging at room temperature, with a stronger reduction at higher solute concentrations. This suggests that over time, solutes diffuse toward GBs (consistent with lattice parameter measurements) thereby reducing intragranular point defect scattering sites. One can note that the peaks of grain size and conductivity (minimum of resistivity) for the two alloying species are offset by ~1 at. %, which can be explained by annihilation of vacancy by solutes in the grain interiors. The present disclosure thus identifies an unexpected concentration regime where the resistivity of Cu—Nb and Cu—Fe alloys is substantially lower than that of their pure Cu counterpart.

In summary, provided here is non-monotonic grain refinement in thin film Cu alloys with Nb and Fe solutes. The grain coarsening in the dilute alloy regime can be attributed to the competing effects of the driving force for grain growth from internal misfit strain and the pinning pressure from kinetic drag effects. The electrical resistivity of thin film Cu alloys decreased by as much as 36% and 51%, relative to pure NC Cu, with the addition of Nb and Fe solutes, respectively in dilute concentration regimes (below about 1.5 at. %). The tailoring of electrical resistivity and grain size by adding solutes at room temperature provides a materials-based perspective on various applications where electrical, mechanical, and thermal considerations predominate such as electronic devices, interconnects, and coating technologies. The disclosed methods can produce mechanically robust and reliable interconnect materials at room temperature, without the need for annealing steps that are not amenable to flexible electronic applications (e.g. wearable device and touch sensors atop polymer substrates), and also paired with electrical resistivities not compromised by alloying.

The following are exemplary embodiments of the presently disclosed invention. The exemplary embodiments are illustrative only and are non-limiting.

Embodiment 1

A nanocrystalline metal alloy thin film for interconnect applications comprising:
a nanocrystalline metal matrix comprising a first metal element, the metal element having a first atomic radius; and
a metal solute dissolved in the nanocrystalline metal matrix, the metal solute having a second atomic radius, and one or more of
(a) the metal solute being present at 0.1 atomic percent ("at. %") to 1.5 at. % compared to the first metal element,
(b) the first atomic radius and the second atomic radius having a difference of between 0 percent and 20 percent of the atomic radius of the first metal element,
(c) the equilibrium solubility of the metal solute in the nanocrystalline metal matrix being less than 0.02, and
(d) the enthalpy of segregation between the nanocrystalline metal matrix and the metal solute being greater than 0 Joule per kilogram. As used herein, "thin film" refers to a layer of material formed by a physical vapor deposition process, for example, sputtering, having a thickness on the scale of, for example, nanometers to micrometers. Also as used herein, "interconnect" refers to an electrical path, i.e., an electroconductive conduit, or to an electroconductive bridge between interconnects. Persons of ordinary skill in the art will readily appreciate metal elements suitable for nanocrystalline matrices for use in electronic applications according to this embodiment. Suitable metals include, for example, copper, silver, gold, aluminum, and the like.

Embodiment 2

A copper alloy thin film for interconnect applications comprising:
nanocrystalline copper; and
at least one solute dissolved in the nanocrystalline copper;
wherein the at least one solute is a non-copper metal characterized as having:
a face-centered or a body-centered cubic or a hexagonal close packed crystalline structure in its single-phase form;
a positive enthalpy of segregation when dissolved in nanocrystalline copper;
an atomic radius mismatch as compared to copper atoms of from about 0 percent to about 20 percent compared to a copper atom; and
low equilibrium solubility in pure copper at room temperature;
such that the copper alloy thin film is characterized as having high atomic lattice misfit strain from substitutional point defects, the lattice misfit strain being defined as η;

where $\eta = (1/\alpha)(\delta\alpha/\delta c)$,

α is the lattice constant of pure copper or copper alloy, and c is the at. % of copper to solute, and wherein
η is 0.2-0.4. As used herein, "positive enthalpy of segregation" refers to a non-zero positive value of enthalpy of segregation. Persons of ordinary skill in the art will readily appreciate that "low equilibrium solubility" as used herein refers to the solute's relative inability to dissolve in the nanocrystalline copper without precipitating, leading to grain boundary segregation effects of the solute in the nanocrystalline copper matrix. Low equilibrium solubilities will be understood to be less than 0.02. As discussed above and as demonstrated in FIG. 3 and schematized in FIG. 5, competing forces of kinetic drag and misfit strain energy can cause solute particles to be sequestered at grain boundaries of the nanocrystalline matrix due to relatively low equilibrium solubility. For example, persons of ordinary skill in the art will recognize the solubility of a solute in a composition can be readily determined by reference to the solute's binary phase diagram.

"High atomic lattice misfit strain" as used herein, as will be appreciated by persons of ordinary skill in the art, refers to an atomic misfit strain within a range of 1:1-1:1.2, this ratio being the ratio of the radius of Cu to that of the solute.

Embodiment 3

A copper alloy thin film for interconnect applications comprising:
nanocrystalline copper; and
at least one solute dissolved in the nanocrystalline copper, the solute comprising one or more of niobium, iron, zirconium, tungsten, or gold;
wherein the copper alloy thin film has a defined thickness. Persons of ordinary skill in the art will recognize that the solute can comprise any metal atom of suitable atomic radius mismatch and compatible crystal structure with copper such that the solute solubilizes in nanocrystalline copper without forming a precipitate.

Embodiment 4

A copper alloy thin film for interconnect applications, comprising:
nanocrystalline copper; and
at least one solute dissolved in the nanocrystalline copper,
wherein the copper alloy thin film has a defined thickness, and
wherein the copper alloy thin film has a specific electrical resistivity lower than that of a pure copper thin film of corresponding thickness. As will readily be recognized by persons of ordinary skill in the art, "specific electrical resistivity" refers to a measurement of the flow of current through a material, and it can be measured, for example, using a 4-point electrical probe method as described herein.

Embodiment 5

A copper alloy thin film for interconnect applications, comprising:
nanocrystalline copper; and
at least one solute dissolved in the nanocrystalline copper;
wherein the copper alloy thin film has a defined thickness; and
wherein the copper alloy thin film has a defined lattice constant characteristic of a non-zero enthalpy of solubility.

Embodiment 6

The copper alloy thin film of any of Embodiments 2-5, wherein the defined thickness is between about 10 nanometers and about 500 nanometers, preferably between about 10 nanometers and 200 nanometers, most preferably about 50 nanometers.

Embodiment 7

The copper alloy thin film of any of Embodiments 2-6, wherein the mean grain size is between about 3 nanometers and about 200 nanometers, preferably greater than about 10.1 nanometers.

Embodiment 8

The copper alloy thin film of any of Embodiments 2-7, wherein the solute is niobium, iron, or any combination thereof.

Embodiment 9

The copper alloy thin film of any of Embodiments 2-8, having a specific electrical resistivity between about 1.7 micro-ohm centimeters and about 15 micro-ohm centimeters, preferably between about 3 micro-ohm centimeters and about 12 micro-ohm centimeters, most preferably about 6 micro-ohm centimeters.

Embodiment 10

The copper alloy thin film of any of Embodiments 2-9, wherein the at least one solute is present at a concentration of between about 0.1 at. % to about 3.0 at. %, preferably between about 0.5 at. % and about 1.5 at. %, most preferably between about 0.5 at. % and about 0.8 at. %.

Embodiment 11

The copper alloy thin film of any of Embodiments 2-9, wherein the at least one solute is niobium present at a concentration of between about 0.1 at. % and about 1.5 at. %, preferably about 0.6 at. %.

Embodiment 12

The copper alloy thin film of any of Embodiments 2-9, wherein the at least one solute is iron present at a concentration of between about 0.1 at. % and about 1.5 at. %, preferably about 0.7 at. %.

Embodiment 13

A method of forming a copper alloy thin film comprising: depositing nanocrystalline copper and copper-M onto a substrate using a physical vapor deposition process directed at a pure copper target and a copper-M target,
- the depositing being performed at from about 0 to about 40° C.;
- wherein copper-M is a copper alloy,
- wherein M comprises niobium or iron, and
- wherein the method produces a copper alloy thin film according to any of Embodiments 2-12. Persons of ordinary skill in the art will readily appreciate alternative physical vapor deposition processes including, for example, sputtering, co-sputtering, thermal or electron-beam evaporation.

Embodiment 14

The method of Embodiment 13, wherein the physical vapor deposition process comprises sputtering.

Embodiment 15

The method of Embodiment 13 or 14, wherein the substrate comprises a material having a degradation temperature of less than about 215° C., preferably less than about 145° C. As will be appreciated by persons of ordinary skill in the art, the degradation temperature of a substrate refers to the temperature at which the composition, including chemical and or physical properties, of the substrate begins to break down or become substantially altered.

Embodiment 16

The method of Embodiment 15, wherein the substrate comprises one or more of tire rubber, polydimethylsiloxane, polyvinylidene fluoride, polypropylene, polyvinyl fluoride, polypropylene, poly-3-hydroxybutyrate, poly(vinyl acetate), polychlorotrifluoroethylene, polyamide, polylactic acid, polyethylene terephthalate, poly(vinyl chloride), poly(vinyl alcohol), polystyrene, poly(methyl methacrylate), acrylonitrile butadiene styrene, polytetrafluoroethylene, poly(carbonate), polysulfone, or polynorbornene.

Embodiment 17

The method of any of Embodiments 13-16, wherein the copper alloy thin film is produced and deposited onto a substrate at a temperature below about 300° C.

Embodiment 18

The method of any of Embodiments 13-17, wherein the copper alloy thin film is produced and deposited onto the substrate in the absence of a thermal annealing or a thermal alloying step.

Embodiment 19

The method of any of Embodiments 13-18, wherein the copper-M target comprises copper at about 0.1 at. % to about 99.9 at. % and M at about 0.1 at. % to about 50 at. %, preferably wherein the copper-M target comprises M at about 0.1 at. % to about 20 at. %.

Embodiment 20

The method of Embodiment 18, wherein M is niobium and the copper-M target is about 50 at. % copper and about 50 at. % niobium, preferably 80 at. % copper and 20 at. % niobium.

Embodiment 21

The method of Embodiment 18, wherein M is iron and the copper-M target is about 50 at. % copper and about 50 at. % iron, preferably 80 at. % copper and 20 at. % iron.

Embodiment 22

The method of any of Embodiments 13-21, comprising maintaining a growth rate of the copper alloy thin film between about 0.02 nanometer per second and about 10 nanometer per second, preferably between about 0.10 nanometer per second and about 0.15 nanometer per second.

Embodiment 23

The method of any of Embodiments 13-22, wherein the physical deposition process (e.g., co-sputtering) is performed at an Argon pressure of $2.6 \times 10^{-2}$ mbar or less, preferably about $5.2 \times 10^{-3}$ mbar. Persons of ordinary skill in the art will readily appreciate that an Ar pressure of $2.6 \times 10^{-2}$ mbar is roughly equivalent to 20 mTorr.

Embodiment 24

The method of any of Embodiments 13-23, wherein the method is a one-step process. As used herein, "one-step process" refers to a method of fabrication requiring substantially only one active step to yield the desired composition. The composition can then undergo further processing to be incorporated into various applications without substantially affecting the properties of the composition.

Embodiment 25

An integrated circuit comprising a copper alloy thin film according to any of Embodiments 2-12.

Embodiment 26

The integrated circuit of Embodiment 25, wherein the integrated circuit is supported by a flexible substrate. A flexible substrate can be any polymer substrate that is pliable, malleable, bendable, or foldable.

Embodiment 27

The integrated circuit of Embodiment 26, wherein the flexible substrate has a degradation temperature of less than about 40° C.

Embodiment 28

The integrated circuit of Embodiment 25, wherein the integrated circuit is supported by a substrate having a degradation temperature of less than about 40° C.

Embodiment 29

The method of any of Embodiments 13-24, wherein the substrate has a degradation temperature of less than about 40° C.

What is claimed:

1. A nanocrystalline metal alloy thin film for interconnect applications, comprising:
a nanocrystalline metal matrix disposed on a substate, the substrate having a degradation temperature of less than about 215° C., the nanocrystalline metal matrix comprising a first metal element, the metal element having a first atomic radius; and
a metal solute dissolved in the nanocrystalline metal matrix via physical vapor deposition, the metal solute having a second atomic radius, the metal solute segregating to grain boundaries of the nanocrystalline metal matrix without thermal annealing, and one or more of
(a) the metal solute being present at 0.1 atomic percent ("at. %") to 1.5 at. % compared to the first metal element,
(b) the first atomic radius and the second atomic radius having a difference of 0 percent to 20 percent of the atomic radius of the first metal element,
(c) the equilibrium solubility of the metal solute in the nanocrystalline metal matrix being less than 0.02, and
(d) the enthalpy of segregation between the nanocrystalline metal matrix and the metal solute being greater than 0 Joule per kilogram.

2. The nanocrystalline metal alloy thin film of claim 1, wherein the nanocrystalline metal alloy thin film defines a thickness between about 10 nanometers and about 500 nanometers.

3. The nanocrystalline metal alloy thin film of claim 2, wherein the nanocrystalline metal alloy thin film defines a thickness between about 10 nanometers and 200 nanometers.

4. The nanocrystalline metal alloy thin film of claim 3, wherein the nanocrystalline metal alloy thin film defines a thickness about 50 nanometers.

5. The nanocrystalline metal alloy thin film of claim 1, wherein the nanocrystalline metal alloy thin film defines a grain size between about 3 nanometers and about 200 nanometers.

6. The nanocrystalline metal alloy thin film of claim 1, wherein the solute is niobium, iron, or any combination thereof.

7. The nanocrystalline metal alloy thin film of claim 1, wherein the nanocrystalline metal alloy thin film has a specific electrical resistivity between about 1.7 micro-ohm centimeters and about 15 micro-ohm centimeters.

8. The nanocrystalline metal alloy thin film of claim 1, wherein the at least one solute is present at a concentration of between about 0.1 at. % to about 3.0 at. %.

9. The nanocrystalline metal alloy thin film of claim 8, wherein the at least one solute is present at a concentration of between about 0.5 at. % and about 1.5 at. %.

10. The nanocrystalline metal alloy thin film of claim 9, wherein the at least one solute is present at a concentration of between about 0.5 at. % and about 0.8 at. %.

11. The nanocrystalline metal alloy thin film of claim 1, wherein the at least one solute is niobium present at a concentration of between about 0.1 at. % and about 1.5 at. %.

12. The nanocrystalline metal alloy thin film of claim 11, wherein the at least one solute is niobium present at a concentration of about 0.6 at. %.

13. The nanocrystalline metal alloy thin film of claim 1, wherein the film is incorporated into an integrated circuit.

14. The nanocrystalline metal alloy thin film of claim 1, wherein the first metal element is copper, and wherein the film is characterized as having high atomic lattice misfit strain from substitutional point defects, the lattice misfit strain being defined as $\eta$;
where $\eta = (1/\alpha)(\delta\alpha/\delta c)$,
$\alpha$ is the lattice constant of pure copper or copper alloy, and c is the at. % of copper to solute, and wherein
$\eta$ is 0.2-0.4.

15. The nanocrystalline metal alloy thin film of claim 1, wherein the physical vapor deposition comprises co-sputtering (i) the metal of the metal alloy thin film with (ii) an alloy of the metal of the metal alloy film and the metal solute.

16. The nanocrystalline metal alloy thin film of claim 1, wherein the substrate has a degradation temperature of less than about 145° C.

\* \* \* \* \*

UNITED STATES PATENT AND TRADEMARK OFFICE
CERTIFICATE OF CORRECTION

PATENT NO. : 11,776,893 B2
APPLICATION NO. : 16/624045
DATED : October 3, 2023
INVENTOR(S) : Daniel S. Gianola et al.

It is certified that error appears in the above-identified patent and that said Letters Patent is hereby corrected as shown below:

On the Title Page

In Other Publications:

Under Column No. 1, Page 2, Line no. 2, Replace:
"Condens. Matters (1996)"
With:
--Condens. Matter 8 (1996)--

Under Column No. 2, Page 2, Line no. 22, Replace:
"Phy. Rev. B ,"
With:
--Phy. Rev. B.,--

Signed and Sealed this
Sixteenth Day of April, 2024

Katherine Kelly Vidal
*Director of the United States Patent and Trademark Office*